United States Patent
Wang (10) Patent No.: US 10,027,306 B2
(45) Date of Patent: Jul. 17, 2018

(54) NON-RECIPROCAL, TUNABLE NOTCH AMPLIFYING RF FRONT-ENDS BASED ON DISTRIBUTEDLY MODULATED CAPACITORS (DMC)

(71) Applicant: THE REGENTS OF THE UNIVERSITY OF CALIFORNIA, Oakland, CA (US)

(72) Inventor: Yuanxun Ethan Wang, Manhattan Beach, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 140 days.

(21) Appl. No.: 14/956,036

(22) Filed: Dec. 1, 2015

(65) Prior Publication Data
US 2016/0156327 A1    Jun. 2, 2016

Related U.S. Application Data

(60) Provisional application No. 62/086,545, filed on Dec. 2, 2014.

(51) Int. Cl.
H03H 7/48 (2006.01)
H03H 7/46 (2006.01)
H03H 7/40 (2006.01)
H03H 7/01 (2006.01)
H05K 1/02 (2006.01)

(52) U.S. Cl.
CPC .............. H03H 7/461 (2013.01); H03H 7/40 (2013.01); H03H 2007/013 (2013.01); H05K 1/0216 (2013.01)

(58) Field of Classification Search
CPC .... H03H 7/461; H03H 7/40; H03H 2007/013; H05K 1/0216
See application file for complete search history.

Primary Examiner — Robert J Pascal
Assistant Examiner — Kimberly Glenn
(74) Attorney, Agent, or Firm — O'Banion & Ritchey LLP; John P. O'Banion (57) ABSTRACT

A tunable notch filter/amplifier based on the non-reciprocal operation of distributedly modulated capacitors (DMC) formed for an RF front end. In one embodiment within the DMC is formed into a ring resonator with a filter between its ends to allow resonance to build up only at an up-converted frequency, and tune the frequency of the whole received band instead of the resonant frequency of the filter alone. In addition a circulator is described for passing different signals in different directions, but at the same frequency, while maintaining signal separation.

24 Claims, 9 Drawing Sheets

NON-RECIPROCAL, TUNABLE NOTCH AMPLIFYING RF FRONT-ENDS BASED ON DISTRIBUTEDLY MODULATED CAPACITORS (DMC)

CROSS-REFERENCE TO RELATED APPLICATIONS

This application claims priority to, and the benefit of, U.S. provisional patent application Ser. No. 62/086,545 filed on Dec. 2, 2014, incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technological Field

This technical disclosure pertains generally to tunable notch filtering within an RF front-end, and more particularly to tunable filters utilizing distributedly modulated capacitor (DMC) technology.

2. Background Discussion

In wireless communication systems it is important to separate the receiver input signal from interferences from the air, receiver output, or from a transmitter. Providing this RF frequency separation requires a sharp filter in the front-end of the communication circuit (receiver or transceiver), which often takes the form of diplexer or multiplexer. Using a tunable filter minimizes the noise and distortion caused by those interferences and is essential for receptions with both high sensitivity and high dynamic range. Yet, it is limiting to have the front end constrained to a particular fixed frequency of operation.

Tunable MEMS cavity filters are an example of current state of the art tunable filters. These filters, however, require a large volume and high tuning voltages up to about 100 volts, while they suffer from very large insertion losses.

Accordingly, a need exists for tunable DMC filters which are suitable for miniature circuitry while exhibiting low insertion losses. The presented tunable filters overcome the shortcomings of prior filters, while providing additional benefits.

BRIEF SUMMARY

The presented technology offers a new technique to realize tunable notch filtering over a broad bandwidth in the front-end of a wireless system, without requiring a trade-off that increases signal noise and signal loss characteristics. A wide range of commercial applications exist, which for example include compact radar systems, high performance RFID readers, and various forms of miniaturized radios, such as those integrated within cellular phones.

In general terms, the technology of this disclosure pertains to tunable filters that employ distributedly modulated capacitor (DMC) technology. Previous work of the inventors relating to this DMC technology is found in Patent Application Publication 2015/0102869 titled "Distributedly Modulated Capacitors For Non-Reciprocal Components", which describes elements of the state of art, and which is incorporated herein by reference.

More specifically, a tunable filter according to the technology of this disclosure tunes the frequency of the whole received band instead of the resonant frequency of the filter. Therefore, a tunable filter for a front end requires a much smaller volume and offers significantly lower insertion losses without the need of high tuning voltage. In addition, the tunable filter is completely electrical and mechanically robust, unlike the MEMS approach which is subject to the effect of vibrations on its mechanical structure.

Accordingly, the presented technology offers a practical, robust and cost efficient way of implementing the tunable filtering in a RF front-end. By way of example and not limitation, the technology can be implemented in a cell phone front-end to filter out interference and to increase signal reception dynamic range, which are important benefits for a new generation of wireless technologies seeking to optimize use of this frequency resource.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only.

DETAILED DESCRIPTION

1. General Embodiment

Figure 1:
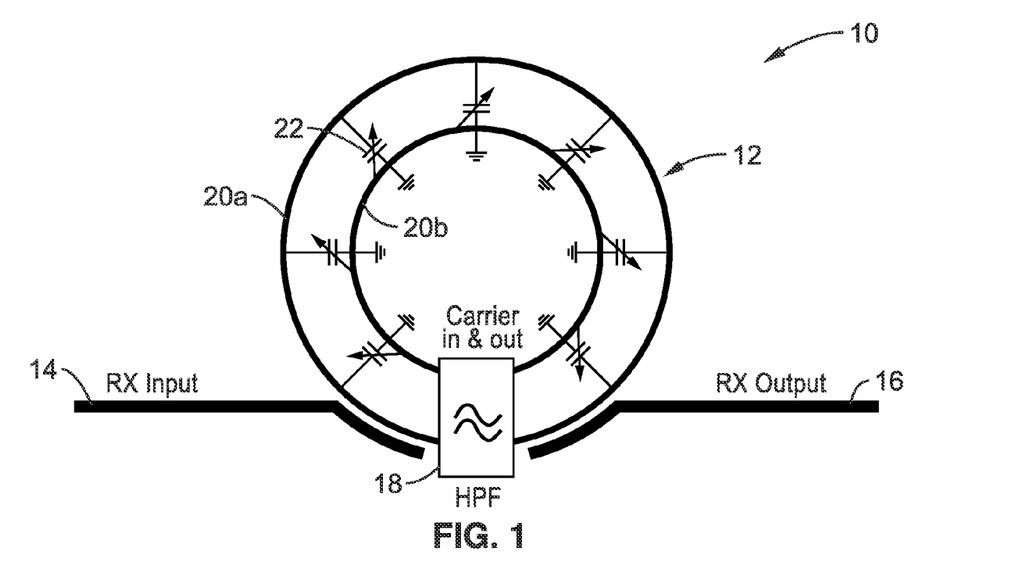
FIG. 1 is a block diagram of a DMC tunable notch filter according to an embodiment of the presented technology.

FIG. 1 illustrates an example embodiment 10 of a distributedly modulated capacitor (DMC) based tunable notch filter of this disclosure comprising a ring resonator 12 which has a fixed resonant frequency coupled with the ring coupled to both input 14 and output 16. It will be appreciated that the input and output (14, 16) can be coupled to the ring resonator 12 by any desired form of proximity coupling, such as a capacitive coupling, or a 90 degree coupler. Ring resonator 12 is shown with two lines 20a, 20b, between which are coupled a plurality of variable capacitors 22. A high pass filter (HPF) 18 is used to break the ring for the original received frequency and to allow the resonance to build up only at the up-converted frequency. The ring resonance notches out a fixed up-converted frequency. The original received band will also be selected correspondingly, except that it is continuously tunable by changing the carrier frequency. The length of the ring is approximately a quarter wavelength at the lowest frequency of operation, which may allow the complete structure to be integrated on-chip in some applications.

Figure 2:
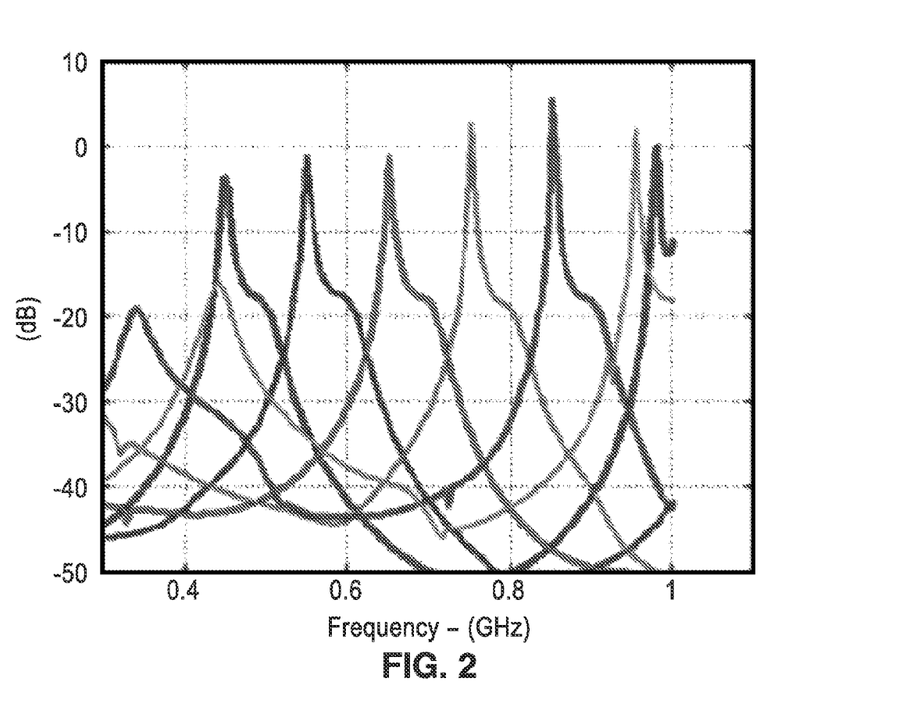
FIG. 2 is a plot of simulated tunable bandpass response for the notch filter show in FIG. 1.

FIG. 2 depicts a simulated tunable bandpass response of the filter. Each curve corresponds to the magnitude of the signal that is received at input 14 and passed to output 16 in FIG. 1 as a function of frequency. The different sets of curves correspond to different carrier frequency selections. It is evident that with each different carrier frequency setting, a corresponding frequency in the received signal is selected and the information at that frequency is passed and amplified, while the rest of the frequency is suppressed.

1.1. TVTL Embodiments

In previous disclosures we investigated some underlying operating principles of DMCs, which are a form of time-varying transmission line (TVTL) with finite length and periodical loading of varactor devices. It should be appreciated that by way of example the varactor devices exemplified herein as varactor diodes which utilize a p-n junction in reverse bias, such that the capacitance of the diode varies with the reverse voltage.

The operating principles of the DMCs were based on: (1) the distributed parametric effect on a time-varying transmission line; and (2) the distributed capacitive mixers. The theoretical bounds of the isolation and insertion performance of DMCs, as well as their noise performance, were also derived and served as guidance to practical implementations. Simulations were carried out and a prototype implemented which consisted of a double-balanced loading of varactor diodes on microstrip lines fabricated on low-loss dielectric printed circuit materials (i.e., Roger's board). The measured results were in close agreement with the theoretical derivations and the simulation results. This preliminary work is summarized as follows.

Figure 3:
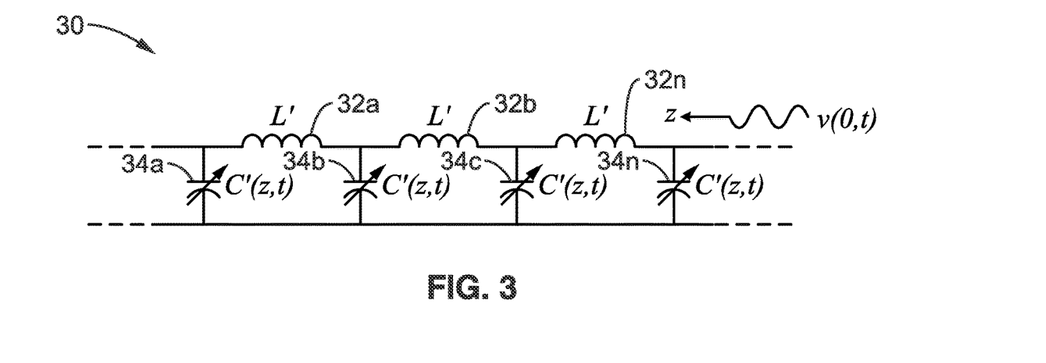
FIG. 3 is a schematic of a time-varying transmission line where the capacitance per unit length is a function of time and space.

FIG. 3 illustrates a lump-element circuit model 30 for a lossless infinite transmission line with time-varying capacitance. In this transmission line 30, series inductors 32a, 32b, . . . , 32n are seen interspersed with variable shunt capacitors 34a, 34b, 34c, . . . , 34n connected between the two lines of the transmission line. The Telegrapher's equations are modified to include the time variation of the capacitance per unit length:

$$\frac{\partial V(z, t)}{\partial z} = -L'\frac{\partial i(z, t)}{\partial t} \tag{1-1}$$

$$\frac{\partial i(z, t)}{\partial z} = -\frac{\partial^2 [C'(z, t)v(z, t)]}{\partial t} \tag{1-2}$$

where L' and C' are inductance and capacitance per unit length, respectively. Rearranging the equations in Eq. (1-1 and 1-2) yields $$\frac{\partial^2 v(z, t)}{\partial z^2} = L'\frac{\partial^2 [C'(z, t)v(z, t)]}{\partial t^2} = 0. \tag{2}$$

When the capacitance is modulated by a single-tone carrier wave traveling in the +z direction at the angular frequency $\omega_m$, the capacitance per unit length under the linear modulation assumption can be written in a general form as $$C'(z, t) = C'_0 + C'_m \cos(\omega_m t - \beta_m z + \phi_m) \tag{3}$$

where $$\frac{\omega_m}{\beta_m} = \frac{1}{\sqrt{LC_0}}$$

where $C'_0$ is the mean capacitance per unit length, $C'_m$ is the amplitude of the capacitance variation per unit length, $\beta_m$ is the phase constant of the carrier with a phase velocity of $v_p = \omega_m/\beta_m = 1/\sqrt{L'C'_0}$. The carrier wave does not carry information. It is assumed that the carrier behaves as a pump signal with uniform amplitude along the transmission line, which drives the time-variation of the transmission line capacitance in a traveling wave fashion.

Conversely, a signal wave is launched into the same transmission line propagating toward the +z direction at the angular frequency $\omega_s$. The signal is mixed up and down with the capacitance modulation signal at the angular frequency $\omega_m$. As the modulation frequency is normally chosen to be greater than the signal frequency ($\omega_m > \omega_s$), one can limit the discussions to three major tones: the input tone $\omega_s$ and both sidebands of the carrier, $\omega_{m-s} = \omega_m - \omega_s$ and $\omega_{m+s} = \omega_m + \omega_s$. Assume the variation of the capacitance is small and the transmission line is non-dispersive over the bandwidth interested:

$$\frac{\omega_s}{\beta_s} = \frac{\omega_{m-s}}{\beta_{m-s}} = \frac{\omega_{m+s}}{\beta_{m+s}} = \frac{\omega_m}{\beta_m} = v_p = \frac{1}{\sqrt{L'C_0'}}. \quad (4)$$

Given the boundary condition $v(0, t) = V_0 \cos(\omega_s t + \phi_s)$ at the source, a solution of Eq. (2) can be derived as follows:

$$v(z, t) = \quad (5\text{-}1)$$
$$V_s(z)\cos(\omega_s t - \beta_s z + \phi_s) + V_{m-s}(z)\sin(\omega_{m-s} t - \beta_{m-s} z + \phi_m - \phi_s) +$$
$$V_{m+s}(z)\sin(\omega_{m+s} t - \beta_{m+s} z + \phi_m + \phi_s).$$

The amplitudes at the three tones in Eq. (5-1) are functions of the propagation distance expressed as the following:

$$V_s(z) = V_0 \cos\left(\frac{1}{2\sqrt{2}} \xi \beta_s z\right), \quad (5\text{-}2)$$

$$V_{m-s}(z) = -\frac{V_0}{\sqrt{2}} \frac{\beta_{m-s}}{\beta_s} \sin\left(\frac{1}{2\sqrt{2}} \xi \beta_s z\right), \quad (5\text{-}3)$$

$$V_{m+s}(z) = -\frac{V_0}{\sqrt{2}} \frac{\beta_{m+s}}{\beta_s} \sin\left(\frac{1}{2\sqrt{2}} \xi \beta_s z\right), \quad (5\text{-}4)$$

where $$\xi = C'_m / C'_0 \quad (5\text{-}5)$$

is defined as the capacitance modulation index.

Comparatively, if the signal wave travels in the opposite direction to that of the carrier wave, no solution can be obtained from Eq. (2), implying no energy is coupled between the signal wave and the waves at the sidebands. The directional dependency of the parametric conversion can thus be used to develop non-reciprocal components. Such directional dependency is capable of separating the signals traveling in opposite directions into different frequency bands at the two ends of the transmission lines. The resulting non-reciprocity is intrinsically broadband as it is not resonance based like a conventional ferrite circulator. Accordingly, the non-reciprocal components promise low loss and low noise characteristics as the structure only consists of reactance based components, as opposed to active (transistor-based) components, or micro-electro-mechanical (MEMS) components. The waves at the up-converted frequencies can reach to the same or greater magnitude than that of the original signal wave, which occurs when a high carrier to signal dictated by the traveling directions of the signal and the carrier waves. The dispersion of DMC, on the other hand, can be utilized to suppress some frequencies, by designing the stop bands at those frequencies as it will be seen in the described work.

Figure 4:
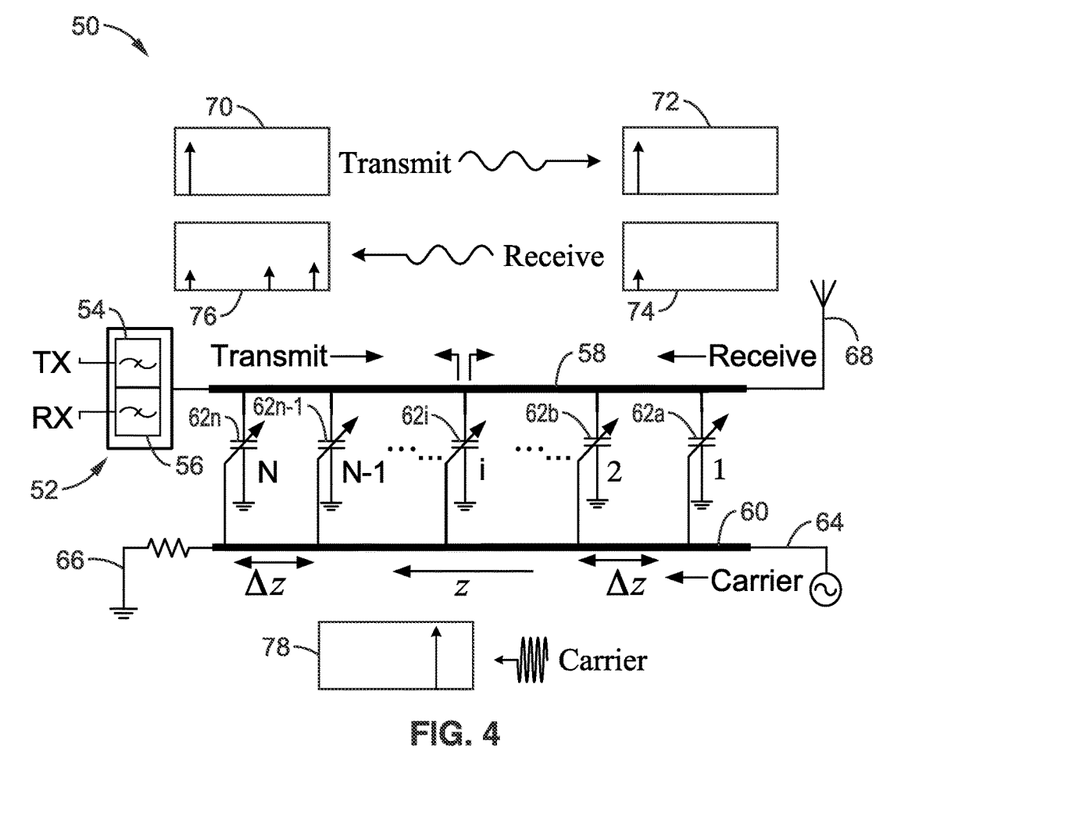
FIG. 4 is a block diagram of the described DMC for circulator applications according to an embodiment of the presented technology.

FIG. 4 illustrates an example embodiment 50 of a DMC connected to an antenna 68 on its right-hand side and a transceiver 52 on its left-hand side. A carrier is injected from the right-hand side of the DMC. The DMC is shown with a transceiver 52 having a transmitter (TX) 54 and receiver (RX) 56. A combination transmit-receive line (TRL) 58 is shown for transmitting and receiving in opposite directions, with a line 60 for a carrier traveling in a single direction. Line 60 is shown with a carrier 64 coupled at a first end and a termination 66 coupled at a second end. A plurality of variable capacitances 62a, 62b, through to 62i, and on through to 62n-1 and 62n (which are varied as N, N-1, through to i, and on through 2 and 1) are coupled between the transmission line 58 and ground. The capacitance of each capacitor is shown being varied in response to the carrier signal on line 60. Obviously, impedance exists ($\Delta z$)) between each capacitor along the transmission line, as denoted in the figure.

The antenna 68 transmits and receives signals at the same frequency. The signal received by antenna 68 travels toward the transceiver 52, and this signal is up-converted by the carrier upon its arrival at the transceiver because it travels in the same direction as the carrier. The transmitted signal, however, does not mix with the carrier. It remains at its original frequency all the way to the antenna. Therefore, the transmitted signal and the received signal are at different frequencies at the transceiver end of the DMC, and with a frequency diplexer they can now be separated into a transmitter port and a receiver port. This separation is seen in the spectra shown in the figure. The transmission is seen 70 leaving TX 54, which arrives with spectrum 72 at the antenna end of the transmission line. However, in regards the receiver, a signal 74 (showing a single component) is received at the receiver, with the spectrum 76 (showing three signal components) reaching RX 56. The carrier 78 is shown conveyed on line 60.

The device illustrated in FIG. 4 plays the role of a circulator if the receiver operating frequency is modified accordingly. The device up shifts the signal frequency if it entered from the antenna and keeps the frequency the same if it enters from the transmitter. The up-shifted received signal is thus routed to the RX port 56 by the diplexer while the transmit signal entered 54 will propagates through to the antenna. This forms the circulator function in which the receiver frequency must be modified by adding the carrier frequency on top of the original frequency in order to receive the up-shifted signal in a proper way.

The noise figure formula for the embodiment of FIG. 4 can thus be derived as $$NF_{(dB)} = 10\log_{10}\left(1 + \frac{1}{3}\frac{\beta_s z}{Q_s} + \frac{16}{\xi^2}\frac{1}{Q_{m\pm s}\beta_{m\pm s}z}\right), \quad (6)$$

where $Q_s$ and $Q_{m\pm s}$ are quality factors of the loaded transmission line respectively at the original received frequency and the up-converted frequencies, which are estimated as $$\begin{cases} Q_s \approx \left[1 + \frac{C_{line}}{C_d}\right]Q_{d,s}, \\ Q_{m\pm s} \approx \left[1 + \frac{C_{line}}{C_d}\right]Q_{d,m\pm s} \end{cases} \quad (7)$$

where $Q_{d,s}$ and $Q_{d,m\pm s}$ are respectively the quality factors of the varactor diodes at the original received frequency and the up-converted frequencies. From Eq. (6), one can see that the second type of noise dominates, until the structure is significantly longer than the wavelength so that the power of the first type of noise will rise to be comparable. It is also evident from Eq. (6) that varactors with high quality factors and high capacitance modulation indices will result in a low noise DMC.

Figure 5A:
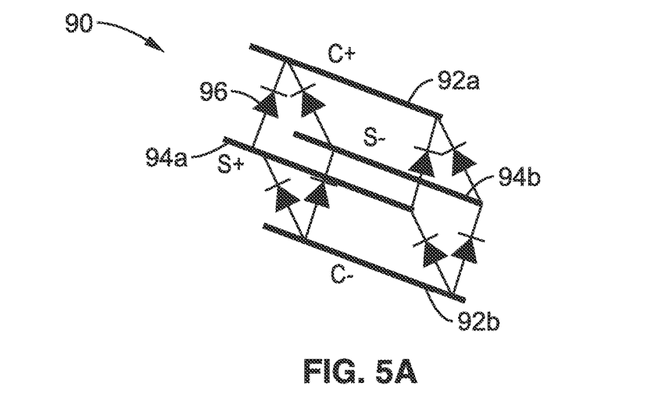
FIG. 5A and FIG. 5B are schematic of a DMC implemented in double balanced fashion, in a transmission line realization with two units in FIG. 5A, and as a microstrip with one unit as seen in FIG. 5B, according to an embodiment of the presented technology.
Figure 5B:
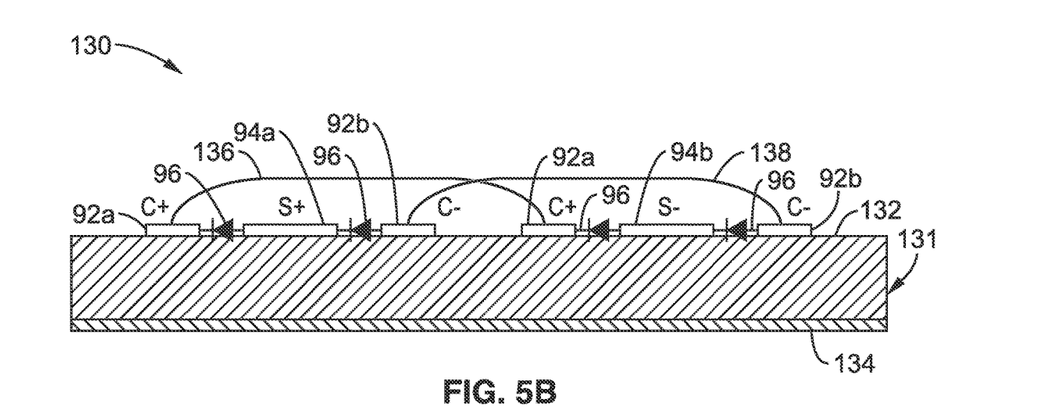

FIG. 5A and FIG. 5B illustrate DMCs implemented in double balanced fashion. In FIG. 5A a transmission line 90 is realized with two units shown in a three dimensional configuration, with carrier lines C+ 92a, C− 92b, signal lines S+ 94a, and S− 94b, and varactor diodes 96 interconnecting between each of the signal lines for each unit cell along these lines. The cathode sides of the varactor diodes are oriented toward C+ 92a and S+ 94a respectively. The double balanced configuration as depicted allows the cancellation of the capacitance modulation caused by the signal voltage and the construction of the capacitance modulation caused by the carrier voltage. This is to achieve the transmission line capacitance modulation solely by the carrier while maintaining the linearity of the signal in transmitting and receiving.

In FIG. 5B a microstrip line implementation 130 is depicted with one unit shown. In this realization, a substrate 131 having a dielectric layer 132 over a ground plane 134. In at least one preferred embodiment, this substrate comprises a microstrip line realization (shown here in cross-section). One can see that C+ 92a, and C− 92b lines are duplicated on each side of lines S+ 94a, and S− 94b which are interconnected between each unit cell with varactor diodes 96, as was seen in FIG. 1. Bonding wires 136, 138, are seen interconnecting the two C+ lines 92a, and the two C− lines 92b. Alternatively, it will be appreciated that the S lines could be duplicated and placed on each side of the C lines.

Figure 6:
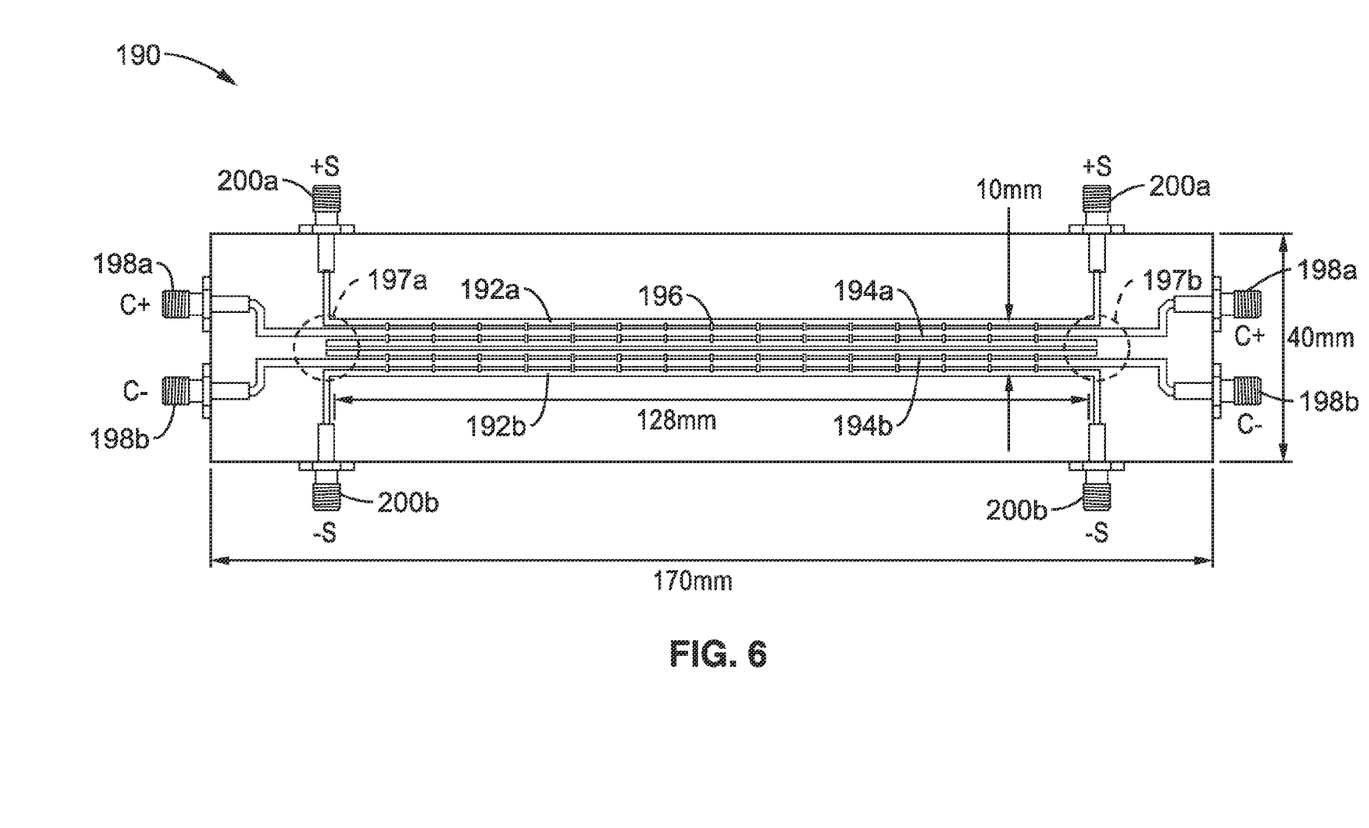
FIG. 6 is a circuit layout of a prototype embodiment of the DMC on a low-loss printed circuit board (PCB) with 16 units of double balanced varactor diodes loaded on the microstrip lines, according to an embodiment of the presented technology.

FIG. 6 illustrates (as a rendition of a photographic image) an embodiment 190 of the microstrip implementation developed on a low-loss dielectric printed circuit board (i.e., Rogers board). In the figure, one can see the signal lines S+ 192a, S− 192b, and carrier line C+ 194a, C− 194b. This example comprises 16 unit cells, each of which contain the four varactor diodes, (as seen in FIG. 1). Structures 197a and 197b at each end of the lines are cross-overs of the transmission lines, the position of which is merely indicated with the dashed line circles to allow seeing the underlying traces. External connections are depicted on each end with carrier C+ 198a, C− 198b, and on the sides with signal +S 200a, −S 200b. The implemented device is seen with a board length of 170 mm, with a width of 40 mm. The actual TRL and carrier lines on that board are seen at 128 mm in length, with a width of 10 mm. It will be appreciated that the sizing shown above is by way of example for this configuration and frequency, and not by way of limitation. The example embodiment of FIG. 6 was fabricated on Roger Duroid substrate with dielectric constant of 3.55 and a thickness of 32 mils.

Figure 7:
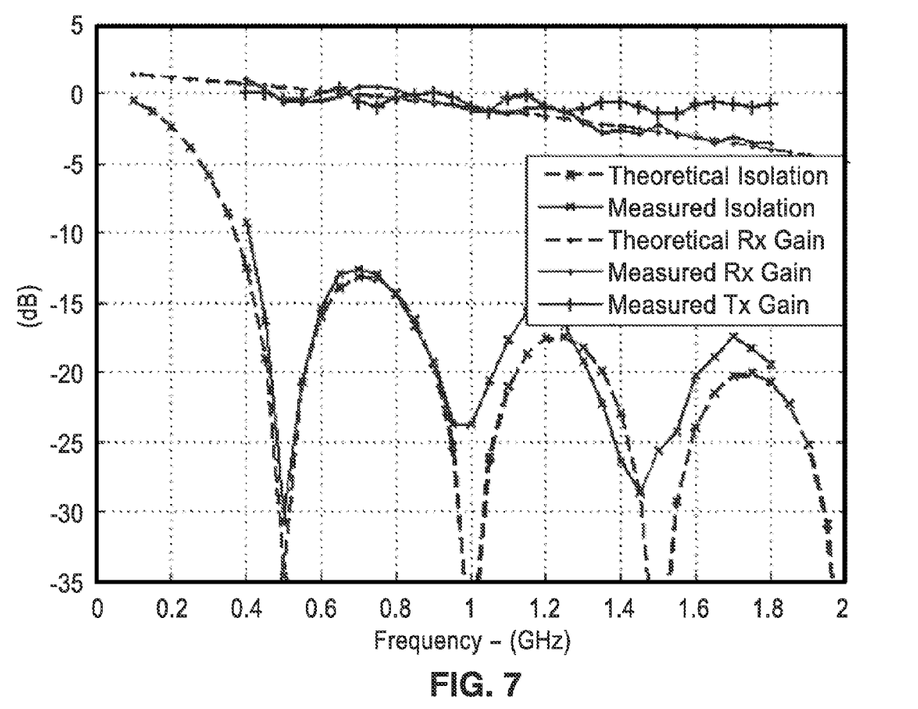
FIG. 7 is a plot of measured insertion and isolation performance of the DMC TVTL according to an embodiment of the presented technology as compared against the theory.

FIG. 7 is a plot of measured insertion loss and the isolation compared against the theory values. It can be seen the measured performance has a high level of agreement with the corresponding theoretical values.

It should be noted that in the previously developed DMC or TVTL structures, the nonlinear terms such as the self-modulation of the signal waves are mostly cancelled with the balanced architecture except the first order modulation term between the signal and the carrier wave. Under such configurations, it is known that the IP3 of the TVTL with commercial devices can reach a few watts and it can be further improved with high breakdown voltage devices. In general, the TVTL can be considered as a linear network whose transfer relationship is only determined by the level and the frequency of the carrier modulation. This is similar to the case when large signal approximation is applied to the mixer analysis. Such a network can thus serve as a fundamental building block for circuit design with more functionality.

The disclosure here will be primarily focused on the novel features resulted when feedbacks and resonances are introduced in the structures. In general, a gain enhancement effect over a narrow bandwidth is expected, which may help to reduce the length of the structure and the power consumption on the carrier while increasing the frequency selectivity. To define the TVTL network property, we start with the assumption that the structure is dispersion free when the incident wave is at the frequency $\omega_s$ and it is in the same direction of the carrier wave. The outgoing waves from the structure at the original signal $\omega_s$, the lower sideband of the up-converted signal $\omega_{m-s}$ and the upper sideband of the up-converted signal $\omega_{m+s}$, are given by Eq. (5). They can be expressed in complex phasors as follows, $$\begin{cases} \tilde{V}_s^-(z) = \cos\left(\frac{1}{2\sqrt{2}}\xi\beta_s z\right)e^{-j\beta_s z}V_0 e^{j\phi_s} = \cos\left(\frac{1}{2\sqrt{2}}\xi\beta_s z\right)e^{-j\beta_s z}\tilde{V}_s^+(0) \\ \tilde{V}_{m-s}^{*-}(z) = -j\frac{1}{\sqrt{2}}\frac{\beta_{m-s}}{\beta_s}\sin\left(\frac{1}{2\sqrt{2}}\xi\beta_s z\right)e^{j\beta_{m-s}z}e^{-j\phi_m}\tilde{V}_s^+(0) \\ \tilde{V}_{m+s}^-(z) = j\frac{1}{\sqrt{2}}\frac{\beta_{m+s}}{\beta_s}\sin\left(\frac{1}{2\sqrt{2}}\xi\beta_s z\right)e^{-j\beta_{m+s}z}e^{j\phi_m}\tilde{V}_s^+(0) \end{cases} \quad (8)$$

where the superscripts "+" and "−" represent incoming and outgoing waves respectively similar to that in the definition of scattering parameters. It is evident from Eq. (8) that the amplitude and phase of the outgoing waves at all the three tones are linearly proportional to that of the incoming wave at the original signal frequency. Alternatively, the outgoing waves out of the network in the case that the incidence is only at the tone $\omega_{m-s}$ are yielded as, $$\begin{cases} \tilde{V}_s^-(z) = j\frac{1}{\sqrt{2}}\frac{\beta_s}{\beta_{m-s}}\sin\left(\frac{1}{2\sqrt{2}}\xi\beta_{m-s}z\right)e^{-j\beta_s z}e^{j\phi_m}\tilde{V}_{m-s}^{*+}(0) \\ \tilde{V}_{m-s}^{*-}(z) = \cos\left(\frac{1}{2\sqrt{2}}\xi\beta_{m-s}z\right)e^{j\beta_{m-s}z}\tilde{V}_{m-s}^{*+}(0) \end{cases} \quad (9)$$

Assuming only the two tones at $\omega_s$ and $\omega_{m-s}$ are of concern and the tone at $\omega_{m+s}$ is free standing, combining Eq. (8) and Eq. (9) yields the following matrix equation between the two tones:

$$\begin{bmatrix} V_s^{\%-}(z) \\ V_{m-s}^{\%*-}(z) \end{bmatrix} = [T_1]\begin{bmatrix} V_s^{\%+}(0) \\ V_{m-s}^{\%*+}(0) \end{bmatrix}. \quad (10)$$

Where $$[T_1] = \begin{bmatrix} \cos\left(\frac{1}{2\sqrt{2}}\xi\beta_s z\right)e^{-j\beta_s z} & j\frac{1}{\sqrt{2}}\frac{\beta_s}{\beta_{m-s}}\sin\left(\frac{1}{2\sqrt{2}}\xi\beta_{m-s}z\right)e^{-j\beta_s z}e^{j\phi_m} \\ -j\frac{1}{\sqrt{2}}\frac{\beta_{m-s}}{\beta_s}\sin\left(\frac{1}{2\sqrt{2}}\xi\beta_s z\right)e^{j\beta_{m-s}z}e^{-j\phi_m} & \cos\left(\frac{1}{2\sqrt{2}}\xi\beta_{m-s}z\right)e^{j\beta_{m-s}z} \end{bmatrix}$$

It shows the coupling across the different frequencies is determined by the propagating distance and the modulation level. On the other hand, such coupling disappears when the incidence is opposite to the propagating direction of the carrier wave, yielding $$\begin{bmatrix} \tilde{V}_s^-(0) \\ \tilde{V}_{m-s}^{*-}(0) \end{bmatrix} = \begin{bmatrix} 1 & 0 \\ 0 & 1 \end{bmatrix} \begin{bmatrix} \tilde{V}_s^+(z) \\ \tilde{V}_{m-s}^{*+}(z) \end{bmatrix}. \tag{11}$$

Figure 8:
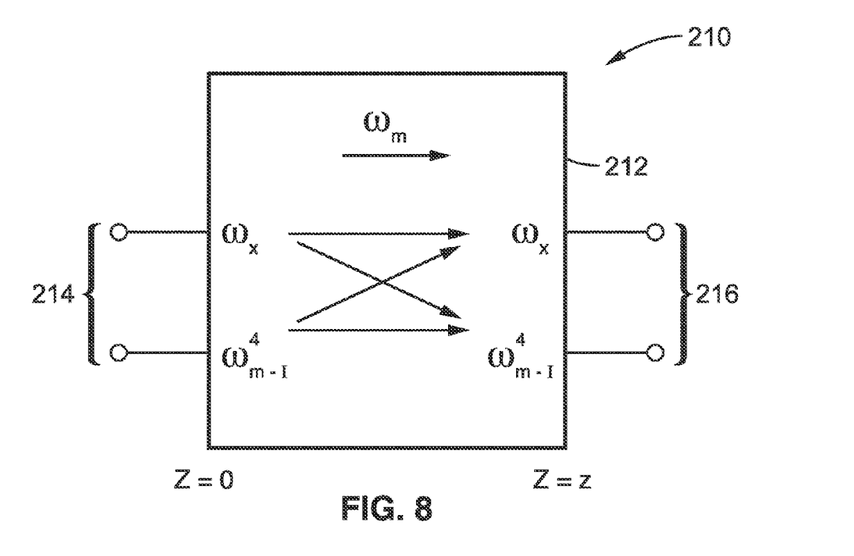
FIG. 8 is a symbol of the TVTL with the non reciprocal, linear coupling across the different frequencies between the ports.

FIG. 8 illustrates 210 a convenient means of representing the non-reciprocal coupling across different frequencies at different ports 214, 216 of the TVTL 212. At a first port 214 Z=0, while at a second port 216 Z=z.

In reality, the TVTL implemented in the form of DMC is a periodic structure with cut-off frequencies. A particularly interesting case is when the cut-off frequency is placed beyond the first two tones, say, $\omega_{m+s}$ and above. The Bloch impedance beyond the cut-off approaches to short circuit so that the voltages on TVTL at those frequencies are forced to be zero. A matrix similar to Eq. (10) can be derived, $$\begin{bmatrix} V_s^{\%-}(z) \\ V_{m-s}^{\%*-}(z) \end{bmatrix} = [T_2] \begin{bmatrix} V_s^{\%+}(0) \\ V_{m-s}^{\%*+}(0) \end{bmatrix} \tag{12}$$

where $$[T_2] = \begin{bmatrix} \cosh\left(\frac{1}{4}\xi\sqrt{\beta_s\beta_{m-s}}\,z\right)e^{-j\beta_s z} & j\sqrt{\frac{\beta_s}{\beta_{m-s}}}\sinh\left(\frac{1}{4}\xi\sqrt{\beta_s\beta_{m-s}}\,z\right)e^{-j\beta_s z}e^{j\phi_m} \\ -j\sqrt{\frac{\beta_{m-s}}{\beta_s}}\sinh\left(\frac{1}{4}\xi\sqrt{\beta_s\beta_{m-s}}\,z\right)e^{j\beta_{m-s}z}e^{-j\phi_m} & \cosh\left(\frac{1}{4}\xi\sqrt{\beta_s\beta_{m-s}}\,z\right)e^{j\beta_{m-s}z} \end{bmatrix}$$

Different from that in Eq. (10), Note that the hyperbolic functions in the diagonal terms in Eq. (12) may yield a number greater than 1, which implies the possibility of exponential amplification for the self-tones.

$$\begin{bmatrix} \tilde{V}_s^-(z) \\ \tilde{V}_{m-s}^{*-}(z) \end{bmatrix} = \begin{bmatrix} t_{11} & t_{12} \\ t_{21} & t_{22} \end{bmatrix} \begin{bmatrix} \tilde{V}_s^+(0) \\ \tilde{V}_{m-s}^{*+}(0) \end{bmatrix} \tag{13}$$

Figure 9:
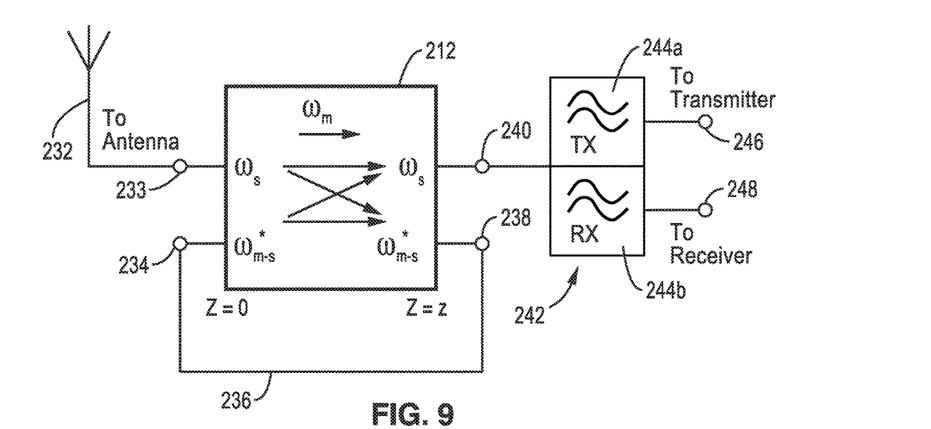
FIG. 9 is a block diagram of a TVTL shown coupled with feedback, resulting in a non-reciprocal, tunable notch amplifier between the RF input and RF output, which may be placed in the front-end.

FIG. 9 illustrates an embodiment 230 of DMC in which an antenna 232 is coupled at a first portion 233 of a first port of TVTL 212, with output from a first portion 240 of a second port to a transceiver 242 having transmitter 244a, and receiver 244b, from which are seen a connection 246 to a transmitter, and 248 to a receiver. The second portions 234, 238 of the first and second ports are seen coupled 236 in a feedback arrangement.

The DMC of FIG. 9 thus illustrates that if the output at $\omega_{m-s}$ is coupled back to the input to form a feedback loop like in a ring resonator, the condition that $\hat{V}^*_{m-s}(z)=\hat{V}^*_{m-s}(0)$ is met. Substituting this condition into Eq. (13) yields:

$$\tilde{V}^*_{m-s}(z)=t_{21}\tilde{V}_s(0)+t_{22}\tilde{V}^{*+}_{m-s}(0)=t_{21}\tilde{V}_s(0)+t_{22}\tilde{V}^{*-}_{m-s}(z) \tag{14}$$

which leads to the following relationship, $$\begin{cases} \tilde{V}_s^-(z) = t_{11} + \dfrac{t_{12}t_{21}}{1-t_{22}}\tilde{V}_s^+(0) = G_{ss}\tilde{V}_s^+(0) \\ \tilde{V}_{m-s}^{*-}(z) = \dfrac{t_{21}}{1-t_{22}}\tilde{V}_s^+(0) = G_{m-s,s}\tilde{V}_s^+(0) \end{cases} \tag{15}$$

where $G_{ss}$ is the voltage gain at the original signal frequency and $G_{m-s,s}$ is the cross frequency voltage gain between the output voltage at $\omega_{m-s}$ and the input voltage at $\omega_s$. It is clear from the above that the feedback allows a resonance to build up at $\omega_{m-s}$ when the denominator $1-t_{22}$ approaches zero. This forms a sharply rising gain around the resonant frequency. The objective of the design is to couple this strong frequency selectivity at $\omega_{m-s}$ to the original RF signal domain at $\omega_s$ through the control of the modulation carrier frequency at $\omega_m$. The resonant frequency coupled to the original RF signal domain is tunable by changing the modulation carrier frequency without the need of modifying the physical resonance of the resonator at $\omega_{m-s}$. Therefore it will be appreciated that the present disclosure can provide a wide range of frequency tuning. A notch amplifier such as this could be applied in a number of beneficial ways, for example by being inserted before the diplexer of a wireless front-end to boost up the received signal power and suppress the blocker interference from adjacent channels. This form of notch amplifier also helps to relieve the diplexer requirement, as the received signal power versus the transmitter leakage into the receiver is effectively increased by the gain of the notch amplifier. To quantitatively analyze the frequency dependency in gain, it yields, $$G_{ss}(z) = \tag{16}$$

$$\left[\cosh\left(\frac{1}{4}\xi_1\sqrt{\beta_s\beta_{m-s}}\,z\right) + \frac{\sinh^2\left(\frac{1}{4}\xi\sqrt{\beta_s\beta_{m-s}}\,z\right)e^{j\beta_{m-s}z}}{1-\cosh\left(\frac{1}{4}\xi\sqrt{\beta_s\beta_{m-s}}\,z\right)e^{j\beta_{m-s}z}}\right]e^{-j\beta_s z}.$$

From Eq. (16), one can conclude that when the structure is sufficiently long and the capacitance modulation index is sufficiently high, instability may form as the hyperbolic cosine function becomes equal or greater than one. To determine the stability condition, one must consider the loss in the transmission line structure, introduced by both transmission line loss and the resistance of the varactor diodes. This is accomplished by replacing $e^{j\beta z}$ terms with $e^{-\alpha z+j\beta z}$ in Eq. (16), which yields, $$G_{ss}(z) = \tag{17}$$

$$\left[\cosh\left(\frac{1}{4}\xi_1\sqrt{\beta_s\beta_{m-s}}\right) + \frac{\sinh^2\left(\frac{1}{4}\xi\sqrt{\beta_s\beta_{m-s}}\,z\right)e^{-\alpha_{m-s}z}}{1-\cosh\left(\frac{1}{4}\xi\sqrt{\beta_s\beta_{m-s}}\,z\right)e^{-\alpha_{m-s}z}e^{\pm j\Delta\beta_{m-s}z}}\right]$$

$$e^{-(\alpha_s+j\beta_s)z}$$

where $\Delta\beta_{m-s}$ is the deviation of $\beta_{m-s}$ from the resonance condition $\beta_{m-s}z=2\pi$. Define $\lambda=1/4\xi\sqrt{\beta_s\beta_{m-s}}$, for small resonators, λz is generally much smaller than one, so Taylor expansions with small variable approximation can be applied to simplify the expression, $$G_{SS}(z) \approx \left[1 + 2\frac{(\lambda z)^2}{-(\lambda z)^2 + 2\alpha_{m-s}z \mp j2\Delta\beta_{m-s}z}e^{-\alpha_{m-s}z}\right]e^{-(\alpha_s + j\beta_s)z} \quad (18)$$

$$= \left[1 + 2\frac{\lambda^2/\beta_{m-s} \cdot z}{-\lambda^2/\beta_{m-s} \cdot z + \frac{2\alpha_{m-s}}{\beta_{m-s}} \mp j\frac{2\Delta\beta_{m-s}}{\beta_{m-s}}}e^{-\alpha_{m-s}z}\right]e^{-(\alpha_s + j\beta_s)z}$$

$$= \left[1 + 2\frac{1/Q_P}{-1/Q_P + 1/Q_{m-s} \mp jB_f}e^{-\alpha_{m-s}z}\right]e^{-(\alpha_s + j\beta_s)z}$$

$$= \left[1 + 2\frac{Q_E}{Q_P}\frac{1}{1 \mp jB_f Q_E}e^{-\alpha_{m-s}z}\right]e^{-(\alpha_s + j\beta_s)z}$$

where $Q_p$ is the parametric quality factor determined by the modulation index and the electrical length of the ring resonator operating frequency. It is defined by $$\frac{1}{Q_P} = \lambda^2/\beta_{m-s} \cdot z = \frac{1}{16}\xi^2 \beta_s z. \quad (19)$$

$$\frac{1}{Q_E} = \frac{1}{Q_{m-s}} - \frac{1}{Q_P}. \quad (20)$$

It should be noted that the enhanced quality factor $Q_E$ is generally greater than the quality factor of the passive ring resonator $Q_{m-s}$, as it is parametrically enhanced with the energy from the carrier supplied into the system through the TVTL. The maximum gain achievable can thus be derived by setting $\Delta\omega_{m-s}=0$ in Eq. (18), which yields, $$G_{ss}(z) \approx \left[1 + 2\frac{Q_E}{Q_P}\right] = \frac{Q_P + Q_{m-s}}{Q_P - Q_{m-s}}. \quad (21)$$

Figure 10:
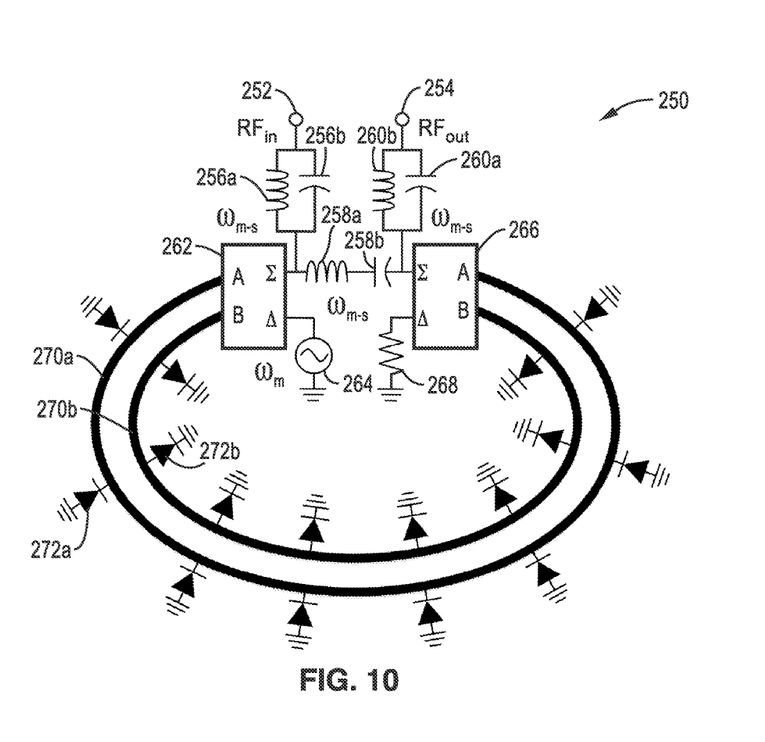
FIG. 10 is a schematic of the TVTL with feedback, operating as non-reciprocal, tunable notch amplifier, according to an embodiment of the presented technology.

FIG. 10 illustrates an example embodiment 250 of the non-reciprocal tunable notch amplifier whose conceptually was depicted in FIG. 9. In FIG. 10, the TVTL is realized with a pair of transmission lines 270a, 270b, loaded with oppositely loaded varactors diodes 272a, 272b. The original RF signal is received at input 252 through a parallel LC (inductor 256a with parallel capacitor 256b), and the modulation carrier 264 are fed to the pair of the transmission lines through a 180 degree hybrid 262, so that the original RF signal drives the lines in a common mode while the modulation carrier drives the line in a difference mode. By doing so, the self-modulation terms, e.g., the capacitance variation caused by the signal voltage, are cancelled while the carrier modulation to the transmission line capacitance are enhanced, after both of them arrive at the second 180-degree hybrid 266, shown with termination 268. The design of the tunable notch amplifier starts by selecting a fixed $\omega_{m-s}$. The RF output at the end of the resonator passes through another parallel LC (inductor 260a with parallel capacitor 260b). A series LC resonator, having inductor 258a in series with capacitor 258b, at this pre-selected frequency is placed between the beginning and the end of the TVTL, passing $\omega_{m-s}$ and rejecting all the other frequencies so that the resonance can only be formed at this single frequency. The RF input and output are tapped into the ring resonator each through a $\omega_{m-s}$ rejecting filter so the energy of the resonance at $\omega_{m-s}$ is isolated from the source and the load of the RF signal.

To validate the theory, Agilent ADS harmonic balance simulations were carried out based on the structure outlined in FIG. 10. Each line in the TVTL was loaded with 16 varactor diodes with the total length being approximately one wavelength at 2.67 GHz. By way of example and not limitation, each diode has a mean capacitance of 0.11 pF with a variation of +/−0.03 pF under the given modulation, and a series resistance of 1.8 Ohm (Ω) according to the standard specs of 0.1 μm GaN HEMT varactor diode technology. The resonance frequency is selected to 7 GHz, which corresponds to the third resonance mode of the ring structure. The modulation carrier frequency is from 7.8 GHz to 9.6 GHz, which corresponds to the input RF frequency of 800 MHz to 2.6 GHz. The carrier power used to drive the TVTL is 19 dBm.

Figure 11A:
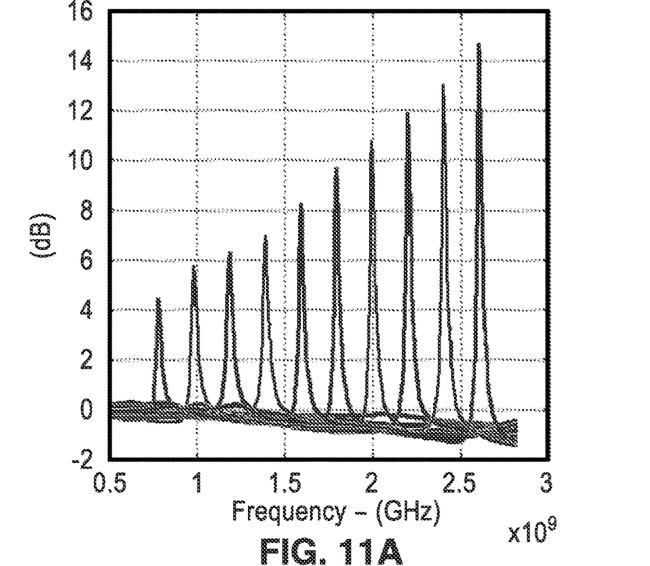
FIG. 11A and FIG. 11B are plots of simulated gain (FIG. 11A) and noise figure (FIG. 11B) of the amplifier circuit shown in FIG. 10, with notches tuned from 800 MHz to 2.6 GHz.
Figure 11B:
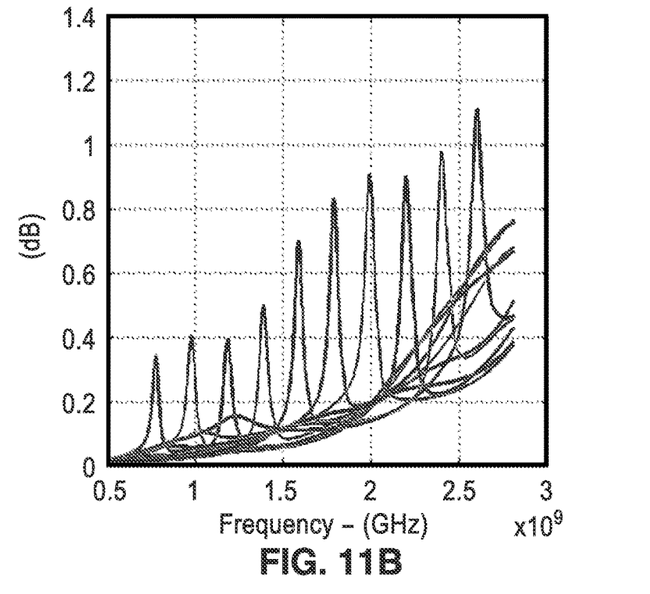

FIG. 11A and FIG. 11B depict plots of simulated gain and noise figure over the tunable notches, respectively. The results show good agreement (matching) with the theory, with demonstration of extremely sharp notches with RF amplifications tunable from 800 MHz to 2.6 GHz. The maximum gain is approximately 15 dB at the 2.6 GHz center frequency, with a 3 dB bandwidth of merely 10 MHz. It corresponds to a system Q of 260 while the intrinsic Q of the resonator is only about 100. This has demonstrated that the system Q is indeed enhanced with the parametric effect. The noise figures are generally low from 0.4 dB to a maximum of 1.1 dB, which are comparable to the noise performance of the state of the art transistor based low noise amplifiers.

Figure 12A:
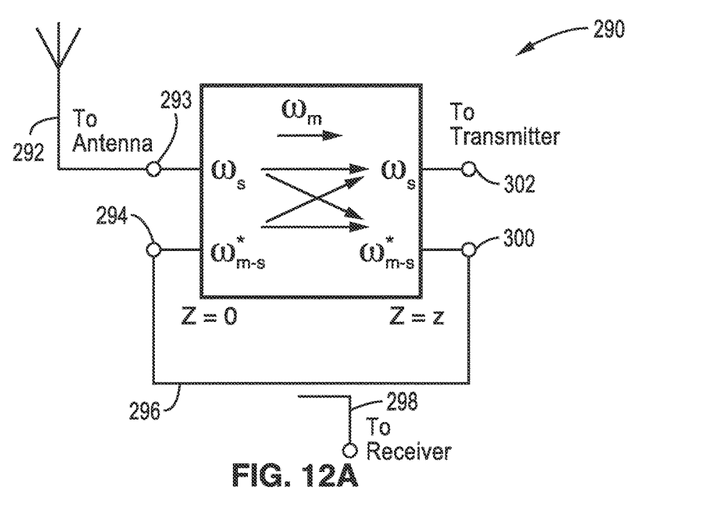
FIG. 12A and FIG. 12B are block diagrams of a tunable notch filter, shown in FIG. 12A with full duplex capabilities, and implemented in FIG. 12B with TVTL, according to an embodiment of the presented technology.

FIG. 12A illustrates another example embodiment 290 with a similar device architecture configured to channel the received signal from the lower sideband of the up-converted signal, e.g., at $\omega_{m-s}$ through an input 293 of the device. A first port is seen with antenna 292 coupled to a first connection 293, and a feedback path 296 coupled between a second connection 294, and a second connection 300 of a second port. The original RF output 302 is now for the transmitting path only (to transmitter), and an output to the receiver 298 seen coupled in the feedback path. The coupling can be achieved with a capacitive coupling, inductive coupling or any other proximity coupling approach. The receiving transfer function of such a device is $G_{m-s,s}$ as described in Eq. (15). As the transmitting and receiving are separated to different frequencies that are far apart (separated at significantly different frequencies) from each other after they pass through this device, a sharp diplexer is no longer needed. It can be used as a circulator providing full duplex capabilities much like the original TVTL without feedback. On the other hand, the receiving path of this device behaves effectively like a tunable filter offering superior suppression to the out of band signals, as the changing of the modulation carrier frequency effectively selects the RF frequency band to be up-converted and amplified to $\omega_{m-s}$. A similar structure like the previous one is simulated in ADS, except in this case a 15 dB coupler is inserted to couple the resonance signal from the ring out to a load.

Figure 12B:
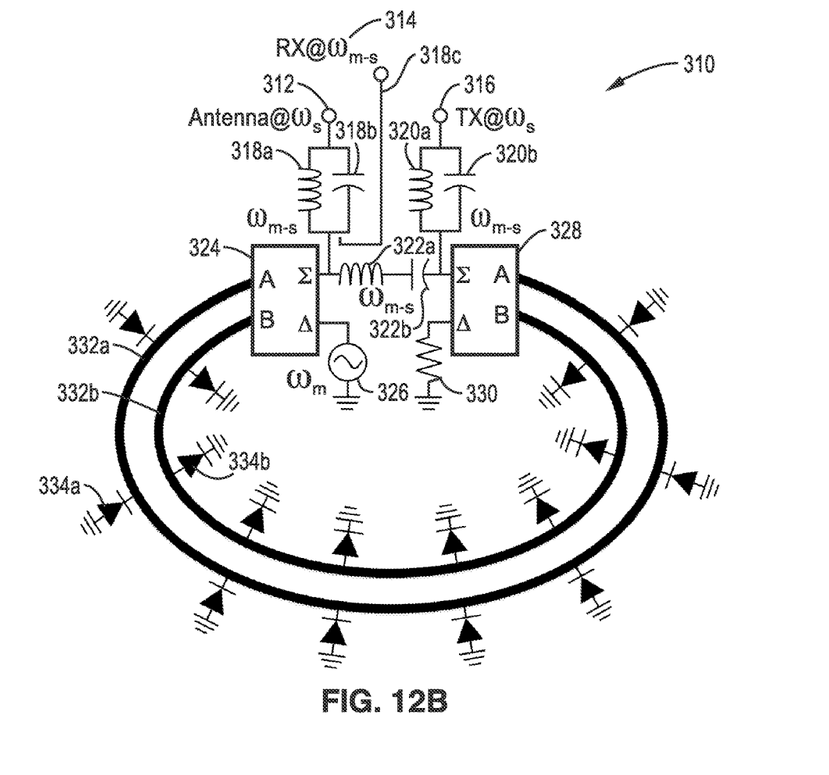

FIG. 12B illustrates an example embodiment 310 of a non-reciprocal tunable notch amplifier having the receiver coupling configuration represented in FIG. 12A. The TVTL has a pair of transmission lines 332a, 332b, loaded with oppositely loaded varactors diodes 334a, 334b. The original RF signal is received at input 312 through a parallel LC (inductor 318a with parallel capacitor 318b), and the modulation carrier 326 are fed to the pair of the transmission lines through a 180 degree hybrid 324. A second 180-degree hybrid 328 is shown with termination 330. A transmitter input 316 is shown passing through another parallel LC (inductor 320a with parallel capacitor 320b) to the sum input of hybrid 328. A series LC resonator, having inductor 322a in series with capacitor 322b are coupled between the beginning and the end of the TVTL. Receiver output 318 is shown with proximity coupling to the series LC resonator (322a, 322b) to provide for the receiver output $RX@\omega_{m-s}$ 314.

Tunable notches with a moderate amount of gain ranging from 4 to 7 dB were achieved over the frequency tuning range of 800 MHz to 2.4 GHz. The system Q is slightly reduced from the previous case due to coupling of the resonance energy to the load. However, out of band suppression is significantly better, mostly in the level of 25 to 30 dB, which is quite good as the fundamental resonant frequency of the ring resonator is 2.67 GHz, which is much higher than the operating frequency here. This implies that a high-Q, low frequency filter may be built with resonators at a much higher frequency. The latter may potentially come with much smaller dimensions and higher quality factor for on-chip applications.

2. Operating Example

Separation of wireless signals in a receiver from the interferences either coming from the air or from the transmitter requires a sharp filter in the front-end often in the form of diplexer or multiplexer. Such a filter will help to minimize the noise and distortion caused by those interferences and is essential for receptions with both high sensitivity and high dynamic range. On the other hand, as the frequency spectrum is becoming more congested, one wishes to have the flexibility of changing the operating frequency of the filter on the fly. The tunability and the insertion loss of a filter often have to be compromised, particularly if one implements it on chip. The state of the art tunable filter technology is MEMS filters requiring a bulky volume and with high tuning voltage almost to a hundred volts.

On the other hand, if a lossless and noiseless frequency mixing device exists, tunable filters will no longer be needed as the whole received band can be moved up and down by the mixer and a fixed filter after the mixer can select and filter different sub-bands. In this disclosure a nonlinear or time-varying transmission line structure is utilized called Distributedly Modulated Capacitor (DMC) to realize frequency mixing and to translate the whole received band in frequency. The frequency mixing behavior in the nonlinear or time-varying transmission line is related to the distributed parametric conversion effects that were intensively studied between 1950's and 1960's. The primary application then was to develop parametric amplifiers out of solid-state devices. The interest, however, diminished later when semiconductor transistors were invented and proven to be an overall better technology as one can easily achieve high gain with devices in a small dimension. Recently, there has been a resurgence of interests in utilizing parametric effects for modern circuits in both hybrid and integrated forms by taking advantage of the intrinsically lower noise characteristics of the reactance based components over the conductance based components.

To develop practical time-varying transmission lines, the so-called Distributedly Modulated Capacitors (DMC), which consists of a set of balanced transmission lines loaded with varactors diodes is described. DMC was implemented in the form of microstrip line, where the broadband non-reciprocal performance was seen to be consistent with the theoretical prediction. The disclosed implementations of Distributedly Modulated Capacitors (DMC) have created a new paradigm for devices operating over a broad band, with low noise, at high power while providing frequency translation capability. The broadband feature and the frequency translation function of DMC can be utilized to develop a front-end with tunable notch filtering capability. As the DMC behaves like a mixer with almost no noise or extremely low noise, it can be used to shift the whole received band in the frequency domain and so the signal through a fixed notch filter can be filtered at the designated frequency. One can thus select the receiving band on the fly without resorting to a sharp tunable diplexer in the conventional sense.

Figure 13:
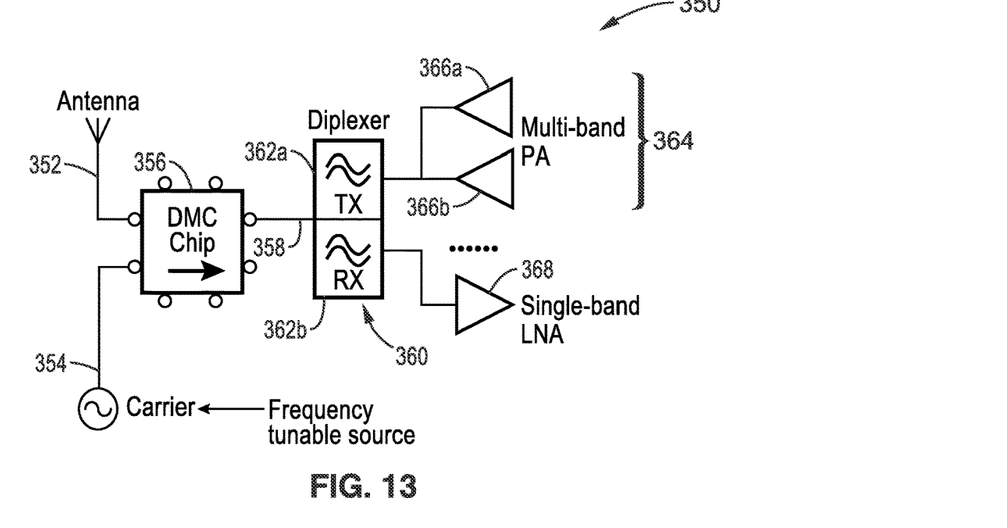
FIG. 13 is a block diagram of a broadband software defined anti-blocker front-end, according to an embodiment of the presented technology.

FIG. 13 illustrates an example embodiment 350 of such a broadband, frequency translation DMC front-end. In the figure an antenna 352 and carrier 354 are shown coupled to a first port of the DMC chip 356, such as implementation of the DMC illustrated in FIG. 8 in either an on-chip form or on a printed circuit board. Output 358 of the DMC is connected to a transceiver 360 having a transmitter (TX) 362a, and receiver (RX) 362b. Signals are seen received by TX 362a through a multiple-band power amplifier (PA) 364, depicted by way of example with amplifiers 366a, 366b. By way of example, signals are seen output from RX 362b through a single-band low-noise amplifier (LNA) 368. A fixed RX filter from DMC 356 is used in conjunction with a tunable carrier input at DMC, and converts the desired received signal into the pass band of the filter while leaving the blocker signal outside the pass band.

Figure 14A:
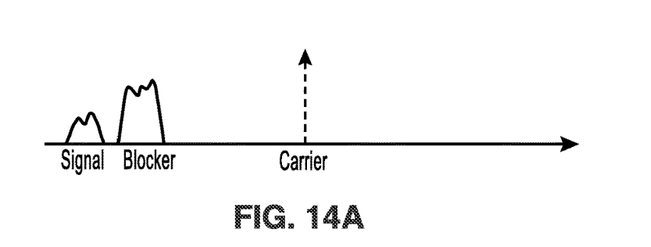
FIG. 14A through FIG. 14C are plots of received signal in the system shown in FIG. 13, as seen at the antenna (FIG. 14A) at the output of the DMC (FIG. 14B), and at the output of the RX filter (FIG. 14C).
Figure 14B:
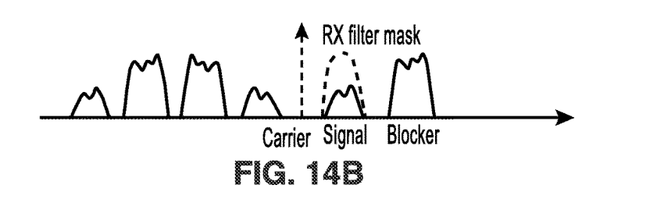
Figure 14C:
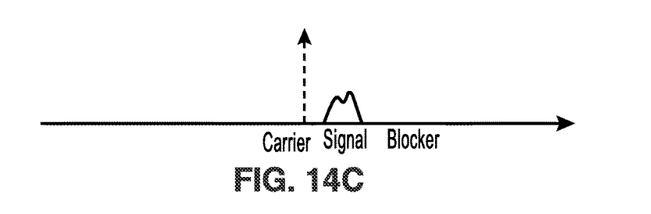

FIG. 14A through FIG. 14C illustrates the sequence of separation of this signal from that of FIG. 13. The received signal is seen at the antenna in FIG. 14A, at the output of the DMC in FIG. 14B, and at the output of the RX filter in FIG. 14C.

In at least one variation, certain advantages are gained in the system front-end of FIG. 13 by integrating the design of the DMC with the fixed filter. The DMC can be included as part of the filter and it can be designed to have a small amount of positive gain to compensate the possible insertion loss. An example of such designs was shown in FIG. 1, where DMC is integrated as part of a ring resonator. The dimension of the ring structure supports resonances at a fixed up-converted signal frequency while it suppresses the possible resonance at the original signal frequency by breaking the loop apart with a high pass filter.

The selection and filtering of the original signal frequency can thus be performed by varying the carrier frequency. The DMC transmission line structure is designed with a moderate loop gain to achieve high quality factor in its frequency selection. A 6 GHz ring resonator is designed, which allows the tuning of the notch filtering at the frequency of 400 MHz to 1 GHz. The simulated results showed highly selective bandpass characteristics with a loaded quality factor in a range of 100 to 200, yet it can be tuned continuously for more than one octave by varying the carrier frequency. It should be noted that the insertion gain is slightly positive for some frequencies due to the parametric amplification effects of the DMC.

From the description herein, it will be appreciated that the present disclosure encompasses multiple embodiments which include, but are not limited to: (a) a distributedly modulated capacitor (DMC) tunable notch filter, (b) a distributedly modulated capacitor (DMC) circulator, and (c) a tunable notch filter comprising a distributedly modulated capacitor (DMC) integrated into a ring resonator.

The present disclosure also encompasses embodiments including, but not limited to, the following:

1. A distributedly modulated capacitor (DMC) tunable notch filter apparatus, comprising: a ring resonator comprising distributedly modulated capacitors (DMC) in a ring structure comprising at least one transmission line; a high pass filter (HPF) interposed within said ring resonator to allow resonance to build up only at an up-converted frequency; a receiver input and carrier signal coupled to said ring resonator which is coupled to a receiver output; wherein said transmission line has a direction dependency for propagating carrier waves in a first direction, and propagating signal waves in a second direction; wherein said distributedly modulated capacitors (DMC) comprise a plurality of time-varying capacitance elements configured for shunt capacitance modulation in response to carrier wave frequency; and wherein said ring resonator notches out a fixed up-converted frequency, providing continuous tunability of a received band in response to changing the carrier frequency, so that it frequency tunes an entire received band instead of a resonant frequency of the high-pass filter (HPF).

2. The apparatus of any preceding embodiment, wherein said DMC tunable notch filter apparatus provides a voltage gain at the signal frequency, whereby the apparatus is also an amplifier.

3. The apparatus of any preceding embodiment, wherein said apparatus comprises only reactance-based components so that insertion loss and noise are minimized in comparison to the use of active transistor-based components, or micro-electro-mechanical (MEMS) components.

4. The apparatus of any preceding embodiment, wherein said carrier wave does not carry information, and behaves as a pump signal with uniform amplitude along said first transmission line to drive time-variation of transmission line capacitance as a traveling wave.

5. The apparatus of any preceding embodiment, wherein said receiver input signal travels in an opposing direction to said carrier wave and is not modulated on said carrier wave.

6. The apparatus of any preceding embodiment, wherein length of said ring resonator is one-quarter wavelength of the lowest frequency of operation.

7. The apparatus of any preceding embodiment, further comprising: a first 180 degree hybrid and a second 180 degree hybrid within said high pass filter; wherein said receiver input is fed to a sum input of said first 180 degree hybrid with said carrier signal fed to a difference input on said first 180 degree hybrid; and wherein said receiver output is generated from a sum output on said second 180 degree hybrid.

8. The apparatus of any preceding embodiment, further comprising a series LC resonator coupled between the sum outputs of the first and second 180 degree hybrids.

9. The apparatus of any preceding embodiment, further comprising tapping said receiver input and said receiver output into said ring resonator each through sideband rejecting filters so the energy of the resonance at the sidebands is isolated from input and output RF signals.

10. The apparatus of any preceding embodiment, further comprising: a first 180 degree hybrid and a second 180 degree hybrid within said high pass filter; wherein said receiver input is fed to a sum input of said first 180 degree hybrid with said carrier signal fed to a difference input on said first 180 degree hybrid; wherein a transmitter input is coupled to a sum output on said second 180 degree hybrid; and a series LC resonator is coupled between sum outputs of said first and second 180 degree hybrids; wherein said receiver output is coupled to the inductor in said LC resonator.

11. The apparatus of any preceding embodiment, wherein said time-varying capacitance elements comprise varactor diodes.

12. The apparatus of any preceding embodiment, wherein said varactor diodes are coupled between conductors of said at least one transmission line, or in which said varactor diodes on each conductor of said at least one transmission line are oppositely coupled to those varactor diodes.

13. The apparatus of any preceding embodiment, wherein said apparatus operating with voltage gain at the signal frequency is configured for connection as a stage preceding a diplexer of a wireless front-end to boost received signal power while suppressing blocker interference from adjacent channels.

14. The apparatus of any preceding embodiment, wherein said distributedly modulated capacitor (DMC) tunable notch filter apparatus is configured for integration as selected from within a group of front end applications consisting of compact radar systems, high performance RFID readers, miniaturized radios, and cellular phones.

15. A distributedly modulated capacitor (DMC) circulator apparatus, comprising: at least one transmission line having distributedly modulated capacitors (DMC) coupled to its conductors; an antenna configured for transmitting signals at a given frequency from a transmitter, and receiving signals at that same given frequency directed towards a receiver; wherein said antenna is coupled to a first side of a first conductor of said at least one transmission line; a carrier signal coupled to a first side of a second conductor of said at least one transmission line; wherein said distributedly modulated capacitors (DMC) comprise a plurality of time-varying capacitance elements configured for shunt capacitance modulation in response to receipt of said carrier signal; a transceiver, having a transmitter and receiver, coupled to a second side of a first conductor of said at least one transmission line; wherein said at least one transmission line is configured for propagating carrier and receiver signal waves from an antenna in a first direction on said at least one transmission line, while at least one transmitter signal is propagated in a second direction, opposite of said first direction, from a transmitter through the at least one transmission line to said antenna; and wherein said carrier signal is modulated to a frequency to create a direction dependency of signal propagation on said at least one transmission line, so that said receiver signal can be readily separated from a transmitted signal.

16. The apparatus of any preceding embodiment, wherein said carrier signal does not carry information, and behaves as a pump signal along said at least one transmission line to drive time-variation of transmission line capacitance as a traveling wave.

17. The apparatus of any preceding embodiment, wherein said time-varying capacitance elements comprise varactor diodes.

18. The apparatus of any preceding embodiment, wherein said varactor diodes are coupled between conductors of said at least one transmission line, or in which said varactor diodes on each conductor of said at least one transmission line are oppositely coupled to those varactor diodes.

19. The apparatus of any preceding embodiment, wherein said receiver signal as received by said antenna travels through said at least one transmission line toward transceiver and is up-converted by said carrier signal upon its arrival at the transceiver because it travels in an identical direction as said carrier signal, while said transmitter signal travels in an opposing direction through said at least one transmission line toward said antenna and does not mix with said carrier signal; whereby said transmitter signal and said receiver signal are at different frequencies at said transceiver and can be separated.

20. The apparatus of any preceding embodiment, further comprising a receiver filter, at a front end of said receiver, which is configured for passing said received signal to said receiver while filtering out other separated frequencies.

21. A distributedly modulated capacitor (DMC) tunable notch filter apparatus, comprising: at least one transmission line having distributedly modulated capacitors (DMC) coupled to its conductors; wherein said at least one transmission line is configured for propagating a receiver signal and a carrier signal in a first direction from a first end of said at least one transmission through said at least one transmission line which up-converts said receiver signal, into an up-converted receiver signal, by said carrier signal because it travels in an identical direction as said carrier signal; wherein said distributedly modulated capacitors (DMC) comprise a plurality of time-varying capacitance elements configured for shunt capacitance modulation in response to receipt of said carrier signal; and a fixed bandpass filter or diplexer coupled to a second end of said at least one transmission line, wherein said fixed bandpass filter or diplexer selects a frequency of said up-converted receiver signal as a receiver output.

22. The apparatus of any preceding embodiment, wherein said carrier signal does not carry information, and behaves as a pump signal along said at least one transmission line to drive time-variation of transmission line capacitance as a traveling wave.

23. The apparatus of any preceding embodiment, wherein said time-varying capacitance elements comprise varactor diodes.

24. The apparatus of any preceding embodiment, wherein said varactor diodes are coupled between conductors of said at least one transmission line, or in which said varactor diodes on each conductor of said at least one transmission line are oppositely coupled to those varactor diodes.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A distributedly modulated capacitor (DMC) tunable notch filter apparatus, comprising:
    a ring resonator comprising distributedly modulated capacitors (DMC) in a ring structure comprising at least one transmission line;
    a high pass filter (HPF) interposed within said ring resonator to allow resonance to build up only at an up-converted frequency;
    a receiver input and carrier signal coupled to said ring resonator which is coupled to a receiver output;
    wherein said transmission line has a direction dependency for propagating carrier waves in a first direction, and propagating signal waves in a second direction;
    wherein said distributedly modulated capacitors (DMC) comprise a plurality of time-varying capacitance elements configured for shunt capacitance modulation in response to carrier wave frequency; and
    wherein said ring resonator notches out a fixed up-converted frequency, providing continuous tunability of a received band, at a signal frequency, in response to changing the carrier frequency, so that said ring resonator frequency tunes an entire received band instead of a resonant frequency of the high-pass filter (HPF).

2. The apparatus as recited in claim 1, wherein said DMC tunable notch filter apparatus provides a voltage gain at the signal frequency, whereby the apparatus is also an amplifier.

3. The apparatus as recited in claim 1, wherein said apparatus comprises only reactance-based components so that insertion loss and noise are minimized in comparison to the use of active transistor-based components, or micro-electro-mechanical (MEMs) components.

4. The apparatus as recited in claim 1, wherein said carrier wave does not carry information, and behaves as a pump signal with uniform amplitude along said first transmission line to drive time-variation of transmission line capacitance as a traveling wave.

5. The apparatus as recited in claim 1, wherein a signal at said receiver input travels in an opposing direction to said carrier wave and is not modulated on said carrier wave.

6. The apparatus as recited in claim 1, wherein length of said ring resonator is one-quarter wavelength of the lowest frequency of operation.

7. The apparatus as recited in claim 1, further comprising:
    a first 180 degree hybrid and a second 180 degree hybrid within said high pass filter;
    wherein said receiver input is fed to a sum input of said first 180 degree hybrid with said carrier signal fed to a difference input on said first 180 degree hybrid; and
    wherein said receiver output is generated from a sum output on said second 180 degree hybrid.

8. The apparatus as recited in claim 7, further comprising a series LC resonator coupled between the sum output of the first and second 180 degree hybrids.

9. The apparatus as recited in claim 7, further comprising tapping said receiver input and said receiver output into said ring resonator each through sideband rejecting filters so energy of resonance at sidebands is isolated from input and output RF signals.

10. The apparatus as recited in claim 1, further comprising:
    a first 180 degree hybrid and a second 180 degree hybrid within said high pass filter;
    wherein said receiver input is fed to a sum input of said first 180 degree hybrid with said carrier signal fed to a difference input on said first 180 degree hybrid;
    wherein a transmitter input is coupled to a sum output on said second 180 degree hybrid; and
    a series LC resonator is coupled between sum outputs of said first and second 180 degree hybrids;
    wherein said receiver output is coupled to the inductor in said LC resonator.

11. The apparatus as recited in claim 1, wherein said time-varying capacitance elements comprise varactor diodes.

12. The apparatus as recited in claim 11, wherein said varactor diodes are coupled between conductors of said at least one transmission line, or in which said varactor diodes on each conductor of said at least one transmission line are oppositely coupled to those varactor diodes.

13. The apparatus as recited in claim 1, wherein said apparatus operating with voltage gain at the signal frequency is configured for connection as a stage preceding a diplexer of a wireless front-end to boost received signal power while suppressing blocker interference from adjacent channels.

14. The apparatus as recited in claim 1, wherein said distributedly modulated capacitor (DMC) tunable notch filter apparatus is configured for integration as selected from within a group of front end applications consisting of compact radar systems, high performance RFID readers, miniaturized radios, and cellular phones.

15. A distributedly modulated capacitor (DMC) circulator apparatus, comprising:
at least one transmission line having distributedly modulated capacitors (DMC) coupled to conductors on said at least one transmission line having a first conductor and a second conductor;
an antenna configured for transmitting signals at a given frequency from a transmitter, and receiving signals at that same given frequency directed towards a receiver;
wherein said antenna is coupled to a first side of said first conductor of said at least one transmission line;
a carrier signal coupled to a first side of said second conductor of said at least one transmission line;
wherein said distributedly modulated capacitors (DMC) comprise a plurality of time-varying capacitance elements configured for shunt capacitance modulation in response to receipt of said carrier signal;
a transceiver, having said transmitter and said receiver, coupled to a second side of said first conductor of said at least one transmission line;
wherein said at least one transmission line is configured for propagating carrier and receiver signal waves from said antenna in a first direction on said at least one transmission line, while at least one transmitter signal is propagated in a second direction, opposite of said first direction, from said transmitter through the at least one transmission line to said antenna; and
wherein said carrier signal is modulated to a frequency to create a direction dependency of signal propagation on said at least one transmission line, so that said receiver signal can be readily separated from the transmitted signal.

16. The apparatus as recited in claim 15, wherein said carrier signal does not carry information, and behaves as a pump signal along said at least one transmission line to drive time-variation of transmission line capacitance as a traveling wave.

17. The apparatus as recited in claim 15, wherein said time-varying capacitance elements comprise varactor diodes.

18. The apparatus as recited in claim 17, wherein said varactor diodes are coupled between said first conductor and said second conductor of said at least one transmission line, or in which said varactor diodes on each conductor of said at least one transmission line are oppositely coupled to those varactor diodes.

19. The apparatus as recited in claim 15, wherein said receiver signal as received by said antenna travels through said at least one transmission line toward said transceiver and is up-converted by said carrier signal upon its arrival at said transceiver because it travels in an identical direction as said carrier signal, while said transmitter signal travels in an opposing direction through said at least one transmission line toward said antenna and does not mix with said carrier signal; whereby said transmitter signal and said receiver signal are at different frequencies at said transceiver and can be separated.

20. The apparatus as recited in claim 15, further comprising a receiver filter, at a front end of said receiver, which is configured for passing said received signal to said receiver while filtering out other separated frequencies.

21. A distributedly modulated capacitor (DMC) tunable notch filter apparatus, comprising:
at least one transmission line having distributedly modulated capacitors (DMC) coupled to conductors on said at least one transmission line having a first conductor and a second conductor;
wherein said at least one transmission line is configured for propagating a receiver signal and a carrier signal in a first direction from a first end of said at least one transmission through said at least one transmission line which up-converts said receiver signal, into an up-converted receiver signal, by said carrier signal because said receiver signal travels in an identical direction as said carrier signal;
wherein said distributedly modulated capacitors (DMC) comprise a plurality of time-varying capacitance elements configured for shunt capacitance modulation in response to receipt of said carrier signal; and
a fixed bandpass filter or diplexer coupled to a second end of said at least one transmission line, wherein said fixed bandpass filter or diplexer selects a frequency of said up-converted receiver signal as a receiver output.

22. The apparatus as recited in claim 21, wherein said carrier signal does not carry information, and behaves as a pump signal along said at least one transmission line to drive time-variation of transmission line capacitance as a traveling wave.

23. The apparatus as recited in claim 21, wherein said time-varying capacitance elements comprise varactor diodes.

24. The apparatus as recited in claim 21, wherein said varactor diodes are coupled between said conductors of said at least one transmission line, or in which said varactor diodes on each conductor of said at least one transmission line are oppositely coupled to those varactor diodes.

* * * * *